United States Patent
Nowak

[11] Patent Number: 6,025,110
[45] Date of Patent: Feb. 15, 2000

[54] METHOD AND APPARATUS FOR GENERATING THREE-DIMENSIONAL OBJECTS USING ABLATION TRANSFER

[76] Inventor: Michael T. Nowak, 300 Pioneer Ct., Simpsonville, S.C. 29681

[21] Appl. No.: 09/246,693

[22] Filed: Jan. 27, 1999

Related U.S. Application Data

[63] Continuation-in-part of application No. 08/933,487, Sep. 18, 1997, abandoned.

[51] Int. Cl.[7] ............................. B05D 5/00; C23C 14/34
[52] U.S. Cl. ..................... 430/200; 430/201; 430/945; 430/269; 156/235; 156/234; 156/233; 427/596; 427/597
[58] Field of Search .............................. 430/200, 201, 430/945, 269; 156/233, 234, 235; 427/596, 597

[56] References Cited

U.S. PATENT DOCUMENTS

| | | | |
|---|---|---|---|
| 4,895,735 | 1/1990 | Cook | 427/43.1 |
| 5,171,650 | 12/1992 | Ellis et al. | 430/201 |
| 5,278,023 | 1/1994 | Bills et al. | 430/201 |
| 5,492,861 | 2/1996 | Opower | 437/173 |
| 5,725,914 | 3/1998 | Opower | 427/592 |

FOREIGN PATENT DOCUMENTS 4339491  5/1994  Germany.

OTHER PUBLICATIONS

Baseman, R.J., et al. "Laser Induced Forward Transfer" Mat. Res. Soc. Symp. Proc. vol. 101, pp. 237–242, 1988.

*Primary Examiner*—Martin Angebranndt
*Attorney, Agent, or Firm*—Cesari and McKenna, LLP

[57] ABSTRACT

A three-dimensional object is generated according to a stored, digital representation through layer-by-layer transfer of material onto a receiver, each layer corresponding to a layer of the three-dimensional representation. Each deposited layer is applied through selective irradiation of an ablation-transfer carrier. The carrier includes a transfer material that is ejected in response to irradiation, and which solidifies on the receiver or on a previously applied layer of transfer material. Thus, irradiation of the carrier in an area pattern corresponding to a layer results in deposition of the transfer material in accordance with the pattern. Sequential irradiations of fresh ablation-transfer carrier material, each according to a two-dimensional pattern corresponding to one of the contiguous layers of the three-dimensional object, result in depositions that gradually build up into the three-dimensional object.

19 Claims, 3 Drawing Sheets

METHOD AND APPARATUS FOR GENERATING THREE-DIMENSIONAL OBJECTS USING ABLATION TRANSFER

RELATED APPLICATION

This is a continuation-in-part of U.S. Ser. No. 08/933,487, filed Sep. 18, 1997, now abandoned.

FIELD OF THE INVENTION

The present invention relates generally to solid-body construction, and more particularly to digitally driven fabrication of three-dimensional objects.

BACKGROUND OF THE INVENTION

The advent of computer-aided design ("CAD") tools capable of digitally representing and rendering three-dimensional objects has engendered efforts to automatically fabricate, based on these representations, replicas of the objects themselves. Three-dimensional modeling systems are particularly useful in prototyping applications, e.g., construction of proposed mechanical parts for the purpose of testing fit and appearance. Rapid prototyping alleviates the need for sophisticated machining or the preparation of molds to form preliminary models that may well be discarded.

Unfortunately, current approaches to automatic model fabrication tend to be cumbersome, expensive and vulnerable to malfunction. For example, available systems frequently employ solid material that is heated and extruded into a flowable state, then exposed to energy that solidifies the material upon deposition; see, e.g., U.S. Pat. Nos. 5,134,569, 5,506,607 and 5,348,604. The need for a continuous supply of fluent material requires specialized heating equipment and conduits that may clog; and the need to resolidify the material using directed energy imposes further equipment demands. Moreover, the need to cure each droplet as it is deposited may restrict the speed of operation.

Other approaches utilize selective sintering or coalescence of a powdered solid; see, e.g., U.S. Pat. Nos. 5,182,170 and 5,354,414. These systems require special containment to handle and minimize loss to the environment of fine granular material, as well as complex equipment and operations.

Some approaches in the prior art utilize lasers in connection with extrusion systems (U.S. Pat. No. 5,208,431), stereolithography (U.S. Pat. No. 5,130,064) or to alter solubility characteristics (U.S. Pat. No. 5,183,598). Again, these systems tend to be complex and cumbersome, utilizing relatively exotic application materials and equipment.

SUMMARY OF THE INVENTION

In accordance with the invention, a three-dimensional object is generated according to a stored, digital representation through layer-by-layer transfer of material onto a receiver, each layer corresponding to a layer of the three-dimensional representation. Each deposited layer is applied through selective irradiation of an ablation-transfer carrier. The carrier comprises a transfer material that is ejected in response to irradiation, and which solidifies on the receiver or on a previously applied layer of transfer material. Thus, irradiation of the carrier in an area pattern corresponding to a layer results in deposition of the transfer material in accordance with the pattern. Sequential irradiations of fresh ablation-transfer carrier material, each according to a two-dimensional pattern corresponding to one of the contiguous layers of the three-dimensional object, result in depositions that gradually build up into the three-dimensional object.

In a representative embodiment, the transfer carrier is a so-called "laser-ablation transfer" or LAT material, irradiation of which by a laser source causes ejection of a transfer material in the region of the incident laser beam. For example, the LAT material may include a carrier layer transparent to laser radiation, a radiation-responsive ejection layer, and a polymeric transfer layer. The LAT material is disposed over a receiver sheet with the transfer layer facing the receiver, and a laser (or its output) situated on the opposite side of the LAT material so that laser output passes through the carrier layer and strikes the transfer layer. This causes the transfer layer to ablate—that is, to heat catastrophically so as to form a controlled amount of expanding gas, which expels a plug of the adjacent transfer material. The ejected transfer material is also heated by the exploding gases. As the ejected plug traverses the space between the LAT material and the receiver sheet, it cools sufficiently (either by contact with air or through the use of a chilling mechanism) to deposit as a solidified droplet rather than completely flattening. The separation distance between the LAT material and the receiver sheet, as well as the cooling mechanism, are chosen so as to facilitate a relatively uniform solidified droplet size. Following deposition of each layer, the separation distance is augmented by an amount approximately equal to the average droplet size to maintain a consistent spacing. In general, objects will be formed of at least six deposition layers, each layer comprising droplets approximately 2–3 mils (i.e., 0.002–0.003 inch) in diameter, the final thickness of the layer being approximately equal to the average diameter of the droplets. For prototyping applications, a typical object may have a deposited thickness of 1 mm or more.

The laser may be carried on an assembly facilitating digitally controlled two-dimensional scanning over an area of the LAT material corresponding to the maximum two-dimensional size of a layer (although it does not matter whether the laser or the LAT material is actually moved to effect the scan). The LAT material itself is preferably provided in roll form and carried on an advancement mechanism that indexes a new area of material opposite the laser following application of a layer.

In another embodiment, the invention is used to apply an electrically conductive (e.g., metal or conductive polymer) coating onto an insulating substrate to form a printed circuit board. In this embodiment, the same pattern may be applied in a single layer or in multiple layers. Moreover, the two embodiments of the invention can be combined to produce multi-level circuit boards with overlapping conductive traces separated by LAT-applied insulating material.

The invention is amenable to construction and convenient operation in the form of a printing device, with the article formed on a table or platen without any special environment, and the LAT material packaged in a replaceable cassette or cartridge. Accordingly, the invention may be designed as an inexpensive, compact computer peripheral; indeed, for construction of small articles, a device embodying the invention may be of a size comparable to that of commercial laser printers.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
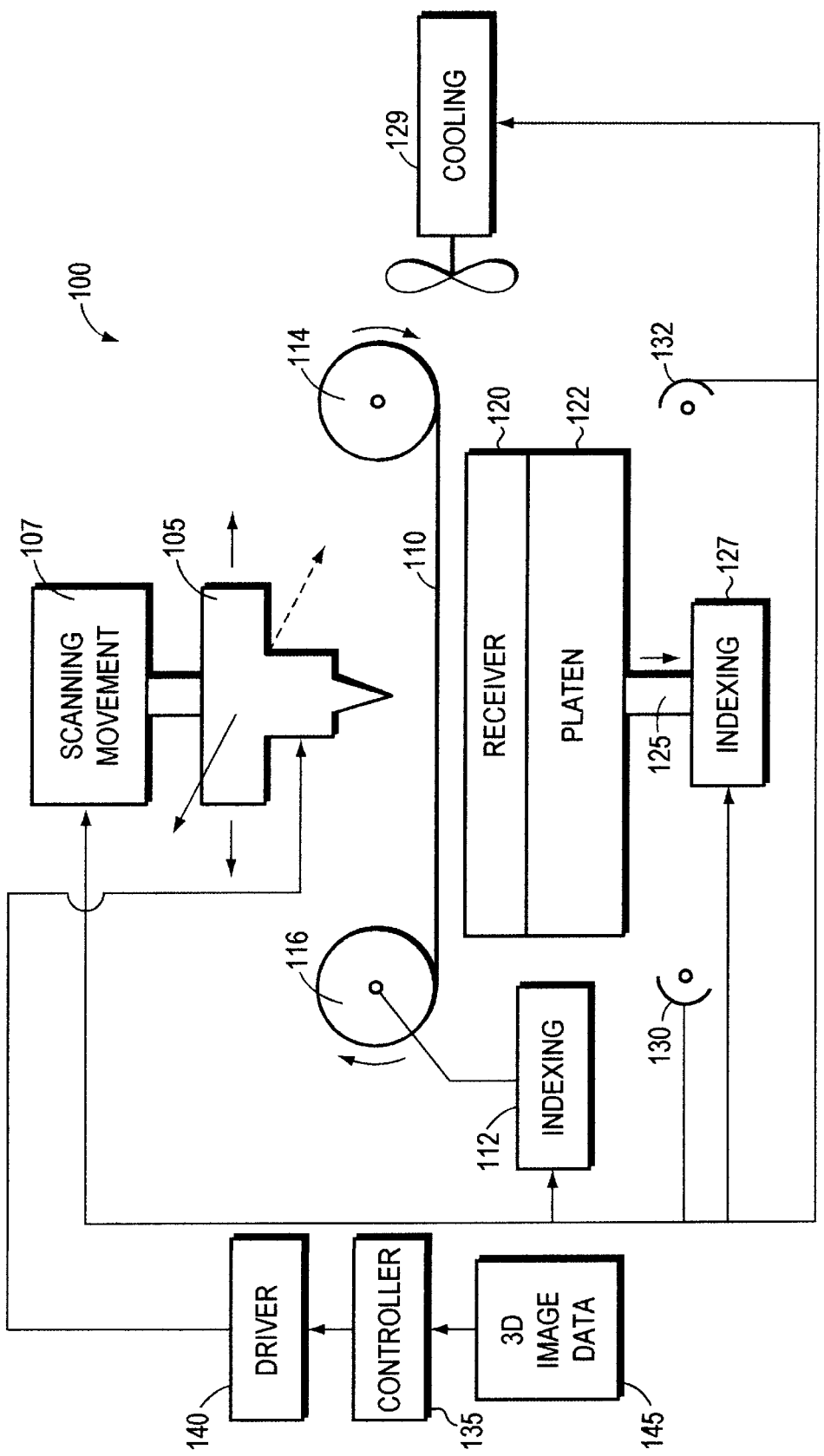
FIG. 1 is a schematic representation of a hardware apparatus embodying the invention.

Refer first to FIG. 1, which shows a hardware apparatus, indicated generally at 100, for practicing the present invention. The apparatus includes at least one (and as many as six or more) digitally operated laser 105 disposed on a carriage or other suitable movement assembly 107 facilitating two-dimensional scanning, as indicated by the arrows. The configuration of movement assembly 107 is not critical, and numerous suitable designs are well characterized in the printing and plotting art. For example, movement assembly 107 may be a flatbed recording arrangement that includes perpendicularly disposed lead screws each rotated by a separate stepper motor. In this case, laser(s) 105 is carried on a writing head communicating with the two lead screws such that rotation of either lead screw advances the writing head in one of two perpendicular directions.

It should be stressed that the laser itself need not be disposed on the writing head or positioned directly opposite LAT material 110. Instead, the output of a fixedly mounted laser can be guided to movement assembly 107 via a fiber-optic cable, with the depicted element 105 representing no more than the terminus of the cable and any necessary focusing optics. The type of laser employed depends, of course, on the nature of the LAT material, as described below. Generally, lasers that emit in the infrared or near-infrared spectral regions are preferred for their low power consumptions and fast switching times; Nd:YAG lasers emitting at $\lambda_{max}$=1064 nm, for example, are well-suited to the invention, but it should be understood that—depending on the choice of LAT material—lasers whose outputs range from the infrared to ultraviolet or X-ray spectral regions can be employed to advantage, as can e-beam or neutron sources. Laser 105 preferably emits a beam focused to a controlled-diameter spot (typically between 0.1 mil (i.e., 0.0001 inch) and 10 mils in diameter, and which varies by no more than 0.1% in diameter). Representative laser powers range from 0.01 to 5 watt/cm$^2$, with 0.5 watt/cm$^2$ being preferred.

Below the output laser 105 is a supply of LAT material 110 in roll or tape form. Associated with LAT material 110 is an indexing assembly 112 for advancing new segments of the material to the scanning area immediately beneath laser 105. Assembly 112 also maintains an appropriate and constant tension between the supply roll 114 and the uptake roll 116 (which may be carried on a single cassette or cartridge), so that LAT material within the scanning area is uniform and unrippled. Suitable indexing arrangements are well known in the art; see, e.g., U.S. Pat. Nos. 5,325,779 and 5,425,309 (the entire disclosures of which are hereby incorporated by reference). A representative arrangment may include a motor associated with the spool around which uptake roll 116 is wound and a metering roller in contact with roll 116, rotation of the metering roller being used to control the motor and ensure advancement of a consistent amount of material. A clutch or spring may be associated with the spool around which supply roll 114 is wound to maintain tension.

Below LAT material 110 is a receiver sheet 120, onto which transfer material is ejected. Receiver sheet 120 is removably disposed on a platen 122. Generally, receiver sheet 120 may be any uniformly surfaced, non-absorbent material capable of receiving the transfer material, and also of withstanding any post-transfer curing treatment applied thereto. Suitable materials include metal (such as aluminum or stainless steel), or a heavy polymer (e.g., polyester) film. Depending on the application, receiver sheet 120 can be dispensed with and the object built up directly on the surface of platen 122.

In the illustrated embodiment, platen 122 is supported on a pillar 125, which is received within a vertical indexing mechanism 127. Each time deposition of a layer onto receiver sheet 120 is completed (that is, each time laser 105 has passed fully over the scanning area, as more fully described below), indexing mechanism 127 lowers platen 122 by a distance approximately equal to the average ejected droplet size (generally around 2 mils). Once again, the precise configuration of indexing mechanism 127 is not critical, suitable designs being well known in the art. Most simply, the circumference of pillar 125 includes a flat, toothed segment that meshes with a rotating gear within mechanism 127; rotation of the gear by a stepper motor linearly indexes pillar 127 by an amount determined by the tooth pitch and the extent of rotation.

A cooling system 129 is employed to maintain an appropriate temperature in the separation region between LAT material 110 and receiver sheet 120, thereby ensuring sufficient coalescence of ejected droplets before they strike receiver sheet 120 or a previously deposited layer. Cooling system 129 may be as simple as a fan providing adequate air circulation, or may instead comprise refrigeration coils and temperature-monitoring circuitry. The configuration and extensiveness of cooling system 129 depends on the type of LAT material employed.

When the object has been fully formed on receiver sheet 120, a post-transfer curing operation may be performed on the transferred material to enhance its solidity and strength. Depending on the material transferred, one or more sources 130, 132 of heat or actinic radiation is activated to cause the uncured material to undergo crosslinking or other chemical reaction. Typically, the deposited object will be self-supporting (i.e., capable of standing on its own), and may be removed from receiver sheet 120 (or platen 122) when fully formed. In general, objects will be formed of at least six deposition layers, each layer comprising droplets approximately 2–3 mils in diameter, the final thickness of the layer being approximately equal to the average diameter of the droplets. Representative objects may have deposited thicknesses of 1 mm or more.

Operation of the system is orchestrated by a controller 135, which operates, by means of digital signals, the driver 140 that actuates laser 105; the movement assembly 107 that scans laser 105 over LAT material 110 (with controller 1 35 constantly tracking the instantaneous two-dimensional position of laser 105 as it scans); indexing assemblies 112 and 127; cooling system 129; and sources 130, 132. The actions of controller 135 are largely determined by a source 145 of three-dimensional data representing the object to be generated. Data source 145 is typically a computer equipped with CAD software that represents the object as a three-dimensional volume of contiguous elements; for purposes of the present invention, the volume is treated as a series of two-dimensional layers contiguous along a third dimension.

In electronic-imaging terms, each layer is represented by a series of picture elements, or "pixels," arranged in discrete locations on a planar grid. However, each layer is treated as having a volumetric thickness so that the set of layers corresponds to the original volume, and the pixels are referred to as "voxels" to connote an (x,y) coordinate defining a two-dimensional position within a layer, and a z coordinate defining the location of the layer itself. In other words, voxels, but not pixels, have thickness, and the three-dimensional extent of a voxel corresponds as closely as possible to the volume of a deposited droplet. For present purposes, the voxels are binary in nature; a voxel is either "turned on," meaning that the object occupies the spatial location denoted by the voxel; or "turned off," connoting empty space.

Figure 2:
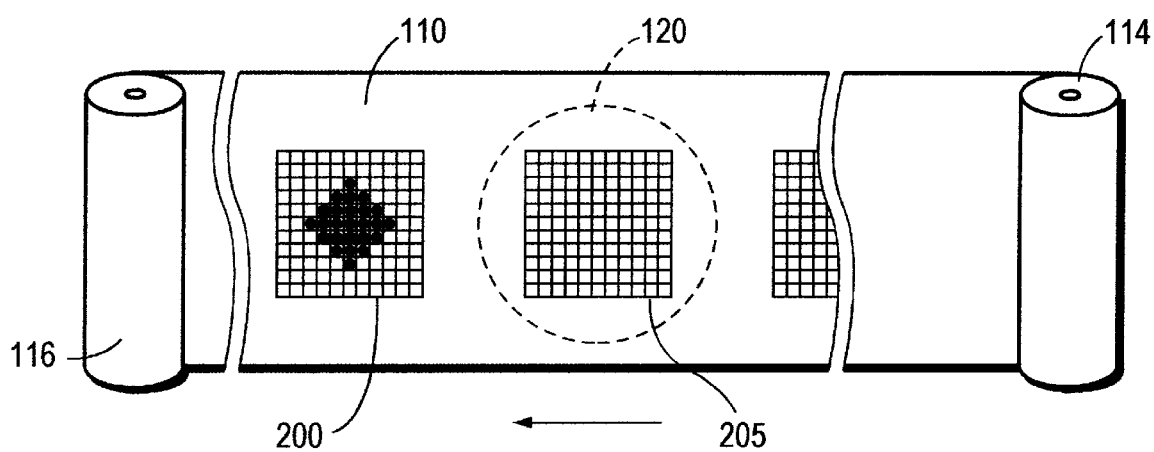
FIG. 2 illustrates the manner in which LAT material is imaged and advanced.

Suitable CAD systems are described, for example, in U.S. Pat. Nos. 5,010,502 and 4,791,579, the entire disclosures of which are hereby incorporated by reference. These systems include processing capacity and programming to generate three-dimensional representations of objects as volumes of voxels, and computer storage capacity to save the representations in digital form. Data source 145 is configured to sequentially transfer to controller 135 voxels corresponding to each layer as ordered lists representing the two-dimensional array. The manner in which controller 135 handles the incoming data is illustrated in FIG. 2.

As shown therein, the tape 110 of LAT material is treated like a photographic film that is exposed in adjacent, identically sized blocks progressively advanced past a camera's lens, whose optics define the block size. Shown in FIG. 2 are two complete exposure blocks 200, 205, and a portion of a third block 210. Each of the blocks represents a scanning region—i.e., the area over which laser 105 is permitted to move by assembly 107. Block 205 represents the current scanning region, directly overlying the receiver sheet 120. The direction of advancement is indicated by the arrow; block 200 has already been scanned.

Each of the blocks is divided, for purposes of laser control, into a two-dimensional grid of positions, corresponding to the voxels of one of the object layers. After the voxels corresponding to the current layer have been received from data source 145 and buffered by controller 135, the controller initiates scanning by activating movement assembly 107 and cooling system 120 (or at least verifying operation of the latter system). As the laser scans over the positions of a block, controller 135 consults the stored voxels and activates laser driver 1 40 only at those block positions corresponding to voxels that are "on." In this way, the voxel pattern representing the current layer is transferred to receiver sheet 120; each time laser 105 is activated, a plug of LAT material is transferred from that position to receiver sheet 120 (or onto a previous layer deposited on sheet 120). After laser 120 has fully scanned a block, controller 135 signals indexing mechanism 112 to advance tape 110 so that a fresh segment of LAT material underlies the scanning region; and also signals vertical indexing mechanism 127 to lower platen 122. When the object has been completely formed on receiver sheet 120, controller 135 disables cooling system 129 and actuates curing sources 130, 132 (if post-transfer curing is envisioned).

Multiple deposition resolutions can be obtained by varying the spot size emitted by laser 105 and the data representation of the object. That is, CAD systems typically permit the user to define the resolution at which the rendered object is represented—i.e., the number of voxels corresponding to each region of volume. Thus, data source 145 can be operated to vary the density of each layer (i.e., the number of grid points in each block 200, 205, 210). At the same time, the beam diameter of laser 105 can be varied to accommodate different data resolutions through adjustment of the power applied by driver 140.

The invention is advantageously employed with any suitable LAT material. Preferred materials fall into two classes.

Figure 3:
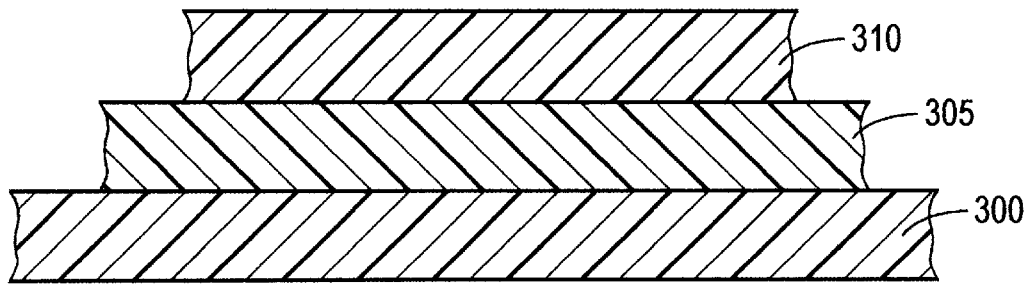
FIGS. 3 and 4 are enlarged sectional views of LAT materials suitable for use with the present invention.

The first class is representatively illustrated in FIG. 3 and comprises a carrier layer 300, an ejection layer 305, and a transfer layer 310. Carrier layer 300 is a mechanically and thermally stable film that is transparent to the energy emitted by laser 105 (i.e., does not absorb substantially in the emission region of the laser). Numerous polymeric films (e.g., polyesters, polysulfones, etc.) are suitable for use as carrier layer 300; a preferred material is MYLAR polyester film (supplied by E.I. duPont de Nemours & Co.) ranging in thickness from 1 to 10 mils, although a preferred range is 2 to 4 mils.

The purpose of layer 305 is to produce a sudden but controlled burst of gas upon exposure to the beam of laser 105. The rapidly expanding gas ejects a plug of transfer layer 310 whose diameter is approximately equal to that of the laser beam. In one approach, layer 310 comprises a self-oxidizing polymer and, dispersed therein, a material that absorbs laser radiation. The self-oxidizing polymer preferably decomposes to produce effective amounts of gas and volatile fragments at temperatures of less than about 200° C. Useful materials include nitrocelluloses and polycarbonates as described, e.g., in U.S. Pat. Nos. 5,156,938 and 5,171,650, the entire disclosures of which are hereby incorporated by reference. The self-oxidizing polymer may be combined with plasticizers or other additives, and/or other polymers (such as ethylcellulose, polyacrylics, polyesters or vinyl polymers) to enhance adhesion to layer 300.

The radiation-absorptive compound, which is dispersed within layer 305 prior to curing, facilitates accumulation of energy in layer 305 and the catastrophic overheating that results in its ablation. The absorptive compound may be a pigment, a dye, or a combination thereof. For infrared-emitting lasers, suitable absorptive pigments include carbon black, titanium oxide (TiO), and other inorganic pigments that absorb in the wavelength region of interest. Useful infrared-absorptive dyes include solubilized nigrosines, e.g., nigrosine oleate, and the CYASORB IR 165, 126 and 99 dyes supplied by Dalloz Safety, Inc., Lakeland, Fla. Following dispersion of the radiation absorber, layer 305 is applied to layer 300 by any suitable coating technique, and cured to a thickness of 0.01 to 20 mils.

Alternatively, the polymer of layer 305 can intrinsically absorb laser radiation through incorporation, within the polymer backbone, of chemical groups that exhibit radiation absorbence. Polymeric compounds containing phthalocyanines or naphthalocyanines, for example, can be used in conjunction with infrared-emitting lasers. Naphthalocyanines suitable for incorporation in this manner are described in U.S. Pat. Nos. 4,977,068, 5,047,312, 5,039,798 and 5,023,168 (the entire disclosures of which are hereby incorporated by reference); analogous compounds that make use of phthalocyanine moieties can also be utilized advantageously.

Layer 310 is formulated to generate a tough, fast-cooling droplet that deposits as a volumetric (and not excessively flattened) mass in response to ablation of layer 305. The degree of cooling necessary within the separation region between tape 110 and receiver sheet 120 (see FIG. 1) depends in part on the phase of layer 310 as it is ejected. If layer 310 ablates, leaving in a volatilized form, more substantial cooling may be necessary to coalesce the material prior to impact. Layer 310 is applied to layer 305 as a coating and cured to a thickness of 0.01 to 50 mils.

Layer 310 generally comprises one or more thermoplastic polymers (e.g., an acrylic, a vinyl or a polyester), a preferred example being the VITEL PE 200 polyester resin supplied by Shell Chemical Company. Alternatively, layer 310 can comprise a reactive (self-crosslinking) polymer, or a mixture of a polymer and a crosslinker, that may be cured following deposition through exposure to heat or actinic radiation. In other words, the polymeric material solidifies upon deposit, but is subsequently crosslinked to form a very durable, mechanically stable structure. Exemplary polymeric systems for this purpose may comprise a low-weight, hydroxyl-functional polyester (e.g., the REACTOL 300 polyester supplied by Lawter Chemical Company) combined with a crosslinker (e.g., the CYMEL 303 hexamethoxymethylmelamine product supplied by American Cyanamid Corporation), or an ultraviolet-curable coating (e.g., the ACRONAL DS 3458 or DS 3429 products supplied by BASF).

Figure 4:
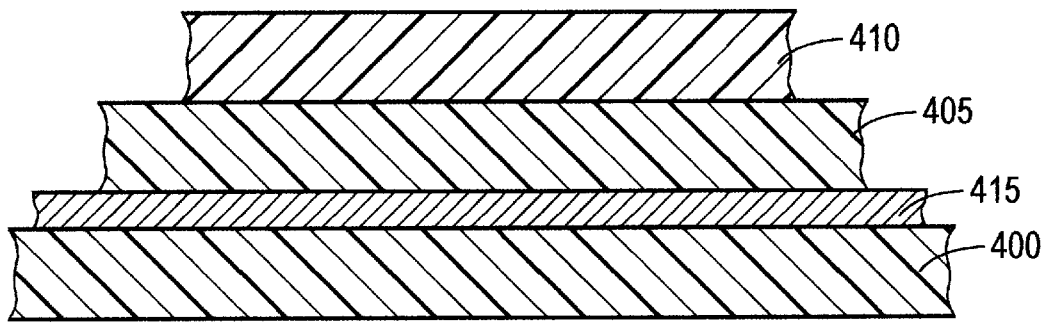

Another suitable form of LAT material is shown in FIG. 4. The layers 400, 410 correspond in formulation and function to layers 300, 310 described above. The construction includes an additional layer 415, however, which ignites in response to incident laser radiation to activate or augment ablation of layer 405. Layer 415 is generally a thin layer of a metal (e.g., aluminum) or one or more metal oxides (preferably titanium oxide (TiO)), but other radiation-absorptive materials—such as oxides of vanadium, manganese, iron or cobalt—can also be used), ranging in thickness from 50 to 1000 μm (and preferably from 200 to 400 μm). Such layers absorb and ablate in response to, e.g., infrared laser radiation.

Layer 405 is once again formulated for ablation, but the presence of layer 415 obviates the need for the integral or dispersed absorptive material or permits use of such material at lower concentrations.

EXAMPLES

The following formulations are suitable for use as layer 305.

EXAMPLE 1

| Ingredients | Amounts (pbw) |
| --- | --- |
| ¼" R/S Nitrocellulose | 10–30 |
| Carbon Black | 5–30 |
| Plasticizer | 5–10 |
| Dispersing Agent | 1–3 |
| Solvent(s) | As needed, 1/1 ratio |

The above formualtion utilizes the the carbon black 250 product supplied by Degussa; the SANTICIZER 9 plasticizer supplied by Monsanto; and a soya lecithin dispersing agent. The solvent may be methyl ethyl ketone, n-propyl acetate, or a combination thereof.

In a representative formulation, 25 wt % methyl ethyl ketone (MEK), 20 wt % n-propyl acetate (nPAC), 10 wt % ¼" R/S nitrocellulose, 5 wt % SANTICIZER 9, and 3 wt % lecithin are combined to homogeneity. To this mixture is added 10 wt % carbon black pigment 250, which is dispersed until off-scale grind is achieved (using, preferably, a shot mill, although a ball mill or a sand mill may be substituted). To the dispersion is added 10 wt % ¼" R/S nitrocellulose, 10 wt % MEK, and 7 wt % nPAC, and the dispersion is mixed until homogeneous.

The preferred technique of applying the coating mixture to a carrier substrate is slot die coating, wherein the coating is applied at 20 to 50 cps through the die onto a moving web of, e.g., MYLAR film. This technique facilitates control of the wet film thickness to within very tight tolerances (e.g., ±2% of nominal). Alternative coating techniques include reverse roll and direct gravure.

EXAMPLE 2

| Ingredients | Amounts (pbw) |
| --- | --- |
| ¼" R/S Nitrocellulose | 10–30 |
| Absorbing dye | 1–5 |
| Solvent(s) | As needed, 1/1 ratio |

For this example, the absorbing dye is the EPOLITE IV-62A dye (which absorbs at 978 nm) supplied by Epolin, Newark, N.J. The solvents are the same as in Example 1.

In a representative formulation, 25 wt % MEK, 20 wt % nPAC, 30 wt % ¼" R/S nitrocellulose, 5 wt % SANTICIZER 9, and 3 wt % of the dye are combined to homogeneity. To this mixture is added 10 wt % ¼" R/S nitrocellulose, 5 wt % MEK, and 2 wt % nPAC. The combination is mixed until homogeneous, and filtered through a 15-micron filter.

The preferred technique of applying the coating mixture to a carrier substrate is slot die coating.

The following formulation is suitable for use as layer 405, which does not require an absorber.

EXAMPLE 3

| Ingredients | Amounts (pbw) |
| --- | --- |
| ¼" R/S Nitrocellulose | 10–30 |
| Absorbing dye | 0–5 |
| Solvent(s) | Balance |

Once again the dye, if employed, may be EPOLITE IV-62A, and the solvents as described in Example 1.

In a representative formulation, 40 wt % MEK, 22 wt % nPAC, 30 wt % ¼" R/S nitrocellulose, 5 wt % SANTICIZER 9, and 3 wt % of the dye are combined to homogeneity, then filtered through a 15-micron filter. The preferred technique of applying the coating mixture to a carrier substrate is slot die coating.

Suitable formulations for layer 310, 410 are as follows:

| | Example | | | | | | |
| --- | --- | --- | --- | --- | --- | --- | --- |
| Ingredients | 4 | 5 | 6 | 7 | 8 | 9 | 10 |
| Vitel PE-200 | 25 | | | | | | |
| NAD-10 | | 50 | | | | | |
| A-10 | | | 25 | | | | |
| REACTOL 100 | | | | 45 | | | |
| CYMEL 303 | | | | 5 | | | |
| ACRONAL DS-3429 | | | | | 50 | | |
| PARACRYL 8030 | | | | | | 65 | |
| 18-290 | | | | | | | 50 |
| Methyl ethyl ketone | 50 | 50 | 25 | | | | |
| n-propyl acetate | 25 | 25 | | | | | |

-continued

| Ingredients | Example | | | | | | |
|---|---|---|---|---|---|---|---|
| | 4 | 5 | 6 | 7 | 8 | 9 | 10 |
| Toluene |  | 50 |  |  | 25 |  | 50 |
| Water |  |  |  |  |  | 35 |  |
| Ethanol |  |  |  | 30 |  |  |  |
| n-propanol |  |  |  | 20 |  |  |  |

All amounts are given in parts by weight. VITEL PE-200 is a polyester resin supplied by Shell Chemical Company; NAD-10 and A-10 are acrylic resins supplied by Rohm & Haas Company; REACTOL 300 is a hydroxyl-functional polyester supplied by Lawter Chemical Company; ACRONAL DS-3429 is an ultraviolet-curable hot-melt polymer supplied by BASF; PARACRYL 8030 is a styrene-acrylic copolymer supplied by Para-Chem; and 18-290 is a polystyrene resin supplied by Amoco. The formulations of Examples 7 and 8 may be cured following application by exposure to actinic (ultraviolet) radiation.

In all of Examples 4–10, the ingredients are dissolved and filtered through a 15-micron filter, and preferably applied using a slot die coater.

In another embodiment, the invention is employed to apply a conductive material to an insulating receiver sheet in accordance with a stored two-dimensional pattern. The conductive material may be applied as a single layer, or in multiple contiguous layers of the same pattern. Thus, a representative LAT material for this application utilizes, as a transfer layer 310, 410, a low-melting metal amalgam (e.g., a solder) or a conductive polymer such as polyaniline (which is preferred), polypyrrole or polythiophene. Operation of the invention in this context is as previously described, with the pattern of the circuit board stored in data source 145.

Moreover, it is possible to combine the polymeric and metal deposition approaches by utilizing two different tapes 110, each alternately movable into position above receiver sheet 120. In this way, multi-layer circuit boards can be produced with overlapping conductive layers (applied from a first tape 110) separated by intervening polymeric (insulating) layers (applied from a second tape 110).

It will therefore be seen that the foregoing represents a highly versatile and conveniently practiced approach to construction of three-dimensional articles. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed. For example, radiation can be applied to the LAT material by numerous means other than laser exposure (e.g., by flood exposure through a mask). Furthermore, scanning of the laser does not require relative movement between the laser and the receiver sheet; instead, light valving or other beam deflection technique can be employed.

What is claimed is:

1. A method of generating a three-dimensional object onto a receiver surface by ablation transfer, the method comprising the steps of:
   a. representing the object as a three-dimensional image comprising a plurality of layers, each layer comprising an array of object positions arranged along first and second dimensions, the layers being contiguous along a third dimension;
   b. providing a transfer carrier comprising first and second opposed surfaces and, on the first surface, a polymeric transfer material, irradiation of the transfer carrier by transfer radiation through the second surface causing ablative ejection of the transfer material from the carrier onto the receiver surface, the receiver surface and the transfer material being separated by a separation distance;
   c. depositing a first layer onto the receiver surface by irradiating the transfer carrier in a pattern corresponding to a first layer of the three-dimensional image; and
   d. depositing at least five additional layers by augmenting the separation distance and irradiating the transfer carrier in patterns corresponding to the additional layers of the three-dimensional image, each successive layer being deposited onto the previous layer.

2. The method of claim 1 wherein step (e) is repeated for each contiguous layer of the image.

3. The method of claim 1 wherein the transfer carrier is irradiated by at least one laser source.

4. The method of claim 3 wherein each depositing step comprises:
   a. causing relative movement between the at least one laser source and the receiver surface, the transfer carrier being disposed between the at least one laser source and the receiver surface, to thereby effect a scan of at least a portion of the transfer carrier; and
   b. actuating the laser source in a pattern corresponding to the array of object positions in a layer so as to deposit the transfer material in accordance with the pattern.

5. The method of claim 4 wherein the transfer carrier is in the form of a tape, and further comprising the step of advancing the tape between depositing steps.

6. The method of claim 3 wherein the laser emits in the infrared region.

7. The method of claim 1 wherein the carrier comprises a sheet substantially transparent to transfer radiation, the polymeric transfer material being applied to a surface thereof and comprising:
   a. a transfer layer comprising a polymeric material; and
   b. an ejection layer disposed between the transfer layer and the transparent sheet, the ejection layer comprising a material that absorbs transfer radiation and, in response thereto, causes ejection of the transfer layer.

8. The method of claim 7 wherein the ejection material comprises a self-oxidizing polymer.

9. The method of claim 8 wherein the self-oxidizing polymer intrinsically absorbs transfer radiation.

10. The method of claim 8 wherein the radiation absorbing material is dispersed in the self-oxidizing polymer.

11. The method of claim 8 wherein the self-oxidizing polymer is selected from the group consisting of nitrocelluloses and polycarbonates.

12. The method of claim 7 wherein the transfer layer comprises at least one thermoplastic polymer.

13. The method of claim 7 wherein the ejection layer comprises an ignition sublayer and a self-oxidizing polymer sublayer, the ignition sublayer igniting upon exposure to transfer radiation.

14. The method of claim 1 further comprising the step of curing the deposited polymeric transfer material.

15. The method of claim 14 wherein the curing step comprises exposing the deposited polymeric transfer material to actinic radiation.

16. The method of claim 14 wherein the curing step comprises exposing the deposited polymeric transfer material to heat.

17. The method of claim 1 wherein each layer is approximately 2 mils thick.

18. The method of claim 1 wherein a sufficient number of layers is deposited such that the object has a thickness of at least 1 mm.

19. The method of claim 1 further comprising the step of removing the three-dimensional object from the receiver surface, the object being self-supporting.

* * * * *